US012676450B2

(12) United States Patent
Xiao et al.

(10) Patent No.: US 12,676,450 B2
(45) Date of Patent: Jul. 7, 2026

(54) HIGH-BRIGHTNESS HIGH-POWER SEMICONDUCTOR LIGHT-EMITTING DEVICE AND METHOD FOR MANUFACTURING SAME

(71) Applicants: SUZHOU EVERBRIGHT PHOTONICS CO., LTD., Suzhou (CN); EVERBRIGHT INSTITUTE OF SEMICONDUCTOR PHOTONICS CO., LTD., Suzhou (CN)

(72) Inventors: Yao Xiao, Suzhou (CN); Jun Wang, Suzhou (CN); Pei Miao, Suzhou (CN); Heng Liu, Suzhou (CN); Quanling Li, Suzhou (CN); Xinsheng Liao, Suzhou (CN); Dayong Min, Suzhou (CN)

(73) Assignees: SUZHOU EVERBRIGHT PHOTONICS CO., LTD. (CN); EVERBRIGHT INSTITUTE OF SEMICONDUCTOR PHOTONICS CO., LTD. (CN)

( * ) Notice: Subject to any disclaimer, the term of this patent is extended or adjusted under 35 U.S.C. 154(b) by 66 days.

(21) Appl. No.: 17/924,290

(22) PCT Filed: Jul. 27, 2022

(86) PCT No.: PCT/CN2022/108230
§ 371 (c)(1),
(2) Date: Nov. 9, 2022

(87) PCT Pub. No.: WO2023/142412
PCT Pub. Date: Aug. 3, 2023

(65) Prior Publication Data
US 2024/0222930 A1 Jul. 4, 2024

(30) Foreign Application Priority Data
Jan. 29, 2022 (CN) .......................... 202210110428.6

(51) Int. Cl.
*H01S 5/026* (2006.01)
*H01S 5/183* (2006.01)

(52) U.S. Cl.
CPC .............. *H01S 5/026* (2013.01); *H01S 5/183* (2013.01)

(58) Field of Classification Search
None
See application file for complete search history.

(56) References Cited

U.S. PATENT DOCUMENTS

2007/0071054 A1    3/2007   Takahashi
2012/0076163 A1*   3/2012   Takeuchi ............ H01S 5/18311
                                                    372/45.01
(Continued)

FOREIGN PATENT DOCUMENTS

CN          2738434   Y     11/2005
CN       101098067   A      1/2008
(Continued)

OTHER PUBLICATIONS

Hatakeyama_English (Year: 2009).*
(Continued)

*Primary Examiner* — Minsun O Harvey
*Assistant Examiner* — Alexander Ehrlich
(74) *Attorney, Agent, or Firm* — MASCHOFF BRENNAN

(57) ABSTRACT

A high-brightness high-power semiconductor light-emitting device and a method for manufacturing same. The high-brightness high-power semiconductor light-emitting device includes: a semiconductor substrate layer; a modulation structure arranged on the semiconductor substrate layer, where the modulation structure includes: a carrier modulation active layer; a modulation tunnel junction arranged on a side of the carrier modulation active layer away from the (Continued)

semiconductor substrate layer; and a cavity extension layer arranged on a side of the modulation tunnel junction away from the carrier modulation active layer; a first active layer arranged on a side of the modulation structure away from the semiconductor substrate layer, where a carrier concentration in the carrier modulation active layer is less than a carrier concentration in the first active layer; and a first current-limiting layer arranged on a side of the first active layer away from the modulation structure. The high-brightness high-power semiconductor light-emitting device can have a high level of integration, high reliability, and low costs while implementing high brightness and high power.

14 Claims, 1 Drawing Sheet

(56)     References Cited

U.S. PATENT DOCUMENTS

| | | | | |
|---|---|---|---|---|
| 2018/0123317 | A1 | 5/2018 | Kanskar et al. | |
| 2018/0358777 | A1* | 12/2018 | Chen | H01S 5/026 |
| 2020/0403379 | A1* | 12/2020 | Huang | H01S 5/18383 |
| 2021/0367407 | A1* | 11/2021 | Yang | H01S 5/18358 |

FOREIGN PATENT DOCUMENTS

| | | | | | |
|---|---|---|---|---|---|
| CN | 101527429 | A | | 9/2009 | |
| CN | 105428999 | A | | 3/2016 | |
| CN | 108666868 | A | | 10/2018 | |
| CN | 109412019 | A | | 3/2019 | |
| CN | 110114945 | A | | 8/2019 | |
| CN | 110998390 | A | | 4/2020 | |
| CN | 111641109 | A | * | 9/2020 | H01S 5/3416 |
| CN | 112531051 | A | | 3/2021 | |
| CN | 114122913 | A | | 3/2022 | |
| EP | 4020725 | A1 | | 6/2022 | |
| JP | 2009081230 | A | * | 4/2009 | H01S 5/18369 |
| WO | 2021249169 | A1 | | 12/2021 | |

OTHER PUBLICATIONS

Wang_English3 (Year: 2020).*
European Patent Office; Extended European Search Report dated Feb. 29, 2024 issued in EP App. No. 22808924.9.
China National Intellectual Property Administration; International Search Report and Written Opinion issued in Int'l App No. PCT/CN2022/108230dated Oct. 18, 2022.
China National Intellectual Property Administration; First Office Action issued in CN App. No. 2022101104286 dated Mar. 9, 2022.

* cited by examiner

HIGH-BRIGHTNESS HIGH-POWER SEMICONDUCTOR LIGHT-EMITTING DEVICE AND METHOD FOR MANUFACTURING SAME

This application claims priority to Chinese patent application No. 202210110428.6, entitled "HIGH-BRIGHT-NESS HIGH-POWER SEMICONDUCTOR LIGHT-EMIT-TING DEVICE AND METHOD FOR MANUFACTURING SAME", filed with the China National Intellectual Property Administration on Saturday, Jan. 29, 2022, the disclosure of which is hereby incorporated by reference in its entirety.

TECHNICAL FIELD

The present application relates to the field of semiconductor technologies, and specifically to a high-brightness high-power semiconductor light-emitting device and a method for manufacturing same.

BACKGROUND

A semiconductor light-emitting device is a device that produces excited emission by using a certain semiconductor material as a working material. The working principle of the device is implementing particle number inversion of non-equilibrium carriers between energy bands (conduction bands and valence bands) of a semiconductor material or between an energy band of a semiconductor material and an energy level of an impurity (an acceptor or a donor) through certain excitation. Excited emission is produced when a large number of electrons and holes in a particle number inversion state recombine. Semiconductor light-emitting devices are widely used because of small sizes and high electro-optical conversion efficiency.

Semiconductor light-emitting devices are applicable to the field of artificial intelligence. With the deep development of the era of artificial intelligence, increasingly high precision of sensor devices are required. A variety of sensing light sources are the eyes of intelligent equipment and the basic components for the detection and perception of external information. With the rapid development in large three-dimensional sensing application scenarios, especially in the field of LIDAR-based unmanned vehicles, higher brightness and power of semiconductor light-emitting devices are required.

Generally, methods for improving the brightness and reducing the divergence angle of surface semiconductor light-emitting devices mainly include: 1. arranging a surface microstructure (for example, manufacturing a surface grating or a surface relief structure) to regulate an optical mode; 2. introducing a high-order mode absorption depletion layer (for example, a metal diffusion layer or a surface metal layer); and 3. introducing an external beam shaping structure (for example, a surface microlens structure or an external cavity structure). All these methods require a complex process manufacturing procedure and have low production controllability and a limited current operating range. The introduction of a high-order mode absorption depletion layer has significant impact on device performance. The introduction of a surface microlens in an external beam shaping structure is also only applicable to back-emitting devices and has significant limitations in used wavelengths. The introduction of an external cavity structure reduces both the level of integration and stability of vertical-cavity surface-emitting semiconductor lasers.

At present, semiconductor light-emitting devices in the prior art cannot have a high level of integration, high reliability, and low costs while implementing high brightness and high power.

SUMMARY OF THE INVENTION

Therefore, a technical problem to be resolved by the present application is to overcome the problem that semiconductor light-emitting devices in the prior art cannot have a high level of integration, high reliability, and low costs while implementing high brightness and high power, and provide a high-brightness high-power semiconductor light-emitting device and a method for manufacturing same.

The present application provides a high-brightness high-power semiconductor light-emitting device, including: a semiconductor substrate layer; a modulation structure arranged on the semiconductor substrate layer, where the modulation structure includes: a carrier modulation active layer; a modulation tunnel junction arranged on a side of the carrier modulation active layer away from the semiconductor substrate layer; and a cavity extension layer arranged on a side of the modulation tunnel junction away from the carrier modulation active layer; a first active layer arranged on a side of the modulation structure away from the semiconductor substrate layer, where a carrier concentration in the carrier modulation active layer is less than a carrier concentration in the first active layer, and the first active layer and the carrier modulation active layer are arranged in the same resonant cavity; and a first current-limiting layer arranged on a side of the first active layer away from modulation structure.

Optionally, a thickness of the cavity extension layer ranges from 0.5 micrometers to 5 micrometers.

Optionally, a material of the cavity extension layer includes InGaAlAs, InGaAsP or InGaN.

Optionally, the carrier concentration in the carrier modulation active layer is less than or equal to 30% of the carrier concentration in the first active layer.

Optionally, a stimulated emission mode field area of the carrier modulation active layer is less than or equal to 50% of a stimulated emission mode field area of the first active layer.

Optionally, the device further includes a first Bragg reflector and a second Bragg reflector that are arranged above the semiconductor substrate layer, where the first Bragg reflector is arranged between the modulation structure and the semiconductor substrate layer, and the second Bragg reflector is arranged on a side of the first current-limiting layer away from the first active layer.

Optionally, a first active layer to a $Q^{th}$ active layer are disposed between the modulation structure and the second Bragg reflector, and Q is an integer greater than or equal to 2; a $(k+1)^{th}$ active layer is arranged on a side of a $k^{th}$ active layer away from the modulation structure, and k is an integer greater than or equal to 1 and less than or equal to Q−1: the high-brightness high-power semiconductor light-emitting device further includes: a first tunnel junction to a $(Q-1)^{th}$ tunnel junction, and a $k^{th}$ tunnel junction is arranged between the $(k+1)^{th}$ active layer and the $k^{th}$ active layer; and the first current-limiting layer is arranged between the first tunnel junction and the first active layer.

Optionally, the device further includes: a first current-limiting layer to a $Q^{th}$ current-limiting layer, where a $k^{th}$ current-limiting layer is arranged between the $k^{th}$ tunnel junction and the $k^{th}$ active layer, and the $Q^{th}$ current-limiting layer is arranged between the second Bragg reflector and the $Q^{th}$ active layer.

The present application further provides a method for manufacturing a high-brightness high-power semiconductor light-emitting device, including: providing a semiconductor substrate layer; forming a modulation structure on the semiconductor substrate layer, where the step of forming a modulation structure includes: forming a carrier modulation active layer on the semiconductor substrate layer; forming a modulation tunnel junction on a side of the carrier modulation active layer away from the semiconductor substrate layer; and forming a cavity extension layer on a side of the modulation tunnel junction away from the carrier modulation active layer; forming a first active layer on a side of the modulation structure away from the semiconductor substrate layer, where a carrier concentration in the carrier modulation active layer is less than a carrier concentration in the first active layer, and the first active layer and the carrier modulation active layer are arranged in the same resonant cavity; and forming a first current-limiting layer on a side of the first active layer away from the modulation structure.

Optionally, the method further includes: before the forming a modulation structure, forming a first Bragg reflector on the semiconductor substrate layer; and forming a second Bragg reflector on a side of the first current-limiting layer away from the first active layer.

Optionally, the method further includes: before the forming a second Bragg reflector, forming a first active layer to a $Q^{th}$ active layer on the side of the modulation structure away from the semiconductor substrate layer, where Q is an integer greater than or equal to 2, a $(k+1)^{th}$ active layer is arranged on a side of a $k^{th}$ active layer away from the modulation structure, and k is an integer greater than or equal to 1 and less than or equal to Q−1: and forming a first tunnel junction to a $(Q-1)^{th}$ tunnel junction, where a $k^{th}$ tunnel junction is arranged between the $(k+1)^{th}$ active layer and the $k^{th}$ active layer, where the step of forming a first current-limiting layer is performed before the first tunnel junction is formed.

Optionally, the method further includes: forming a first current-limiting layer to a $Q^{th}$ current-limiting layer, where a $k^{th}$ current-limiting layer is formed before the $k^{th}$ tunnel junction is formed and after the $k^{th}$ active layer is formed, and the $Q^{th}$ current-limiting layer is arranged between the second Bragg reflector and the $Q^{th}$ active layer.

Optionally, a thickness of the cavity extension layer ranges from 0.5 micrometers to 5 micrometers.

Optionally, the carrier concentration in the carrier modulation active layer is less than or equal to 30% of the carrier concentration in the first active layer.

Optionally, a stimulated emission mode field area of the carrier modulation active layer is less than or equal to 50% of a stimulated emission mode field area of the first active layer.

The present application further provides a high-brightness high-power semiconductor light-emitting device, including an active area and a carrier modulation active layer, where a carrier concentration in the carrier modulation active layer is lower than a carrier concentration in the active area, the carrier modulation active layer is used for generating low-order mode light and adjust, by feedback, the active area to emit low-order mode light, the active area includes a first active layer, and the first active layer and the carrier modulation active layer are arranged in the same resonant cavity.

The technical solutions of the present application have the following beneficial effects.

In the high-brightness high-power semiconductor light-emitting device provided in the technical solution of the present application, the first current-limiting layer makes carriers pass through a central area of the first active layer instead of an edge area of the first active layer. The carriers pass through the cavity extension layer after passing through the first active layer. As the carriers pass through the cavity extension layer, the carriers further diffuse laterally, and as a result the density of the carriers decreases. After the carriers pass through a modulation tunnel junction, electrons and holes are redistributed in an energy band and are then further recombined in the carrier modulation active layer. In this way, under the same current injection, the carrier concentration in the carrier modulation active layer is lower than the carrier concentration in the first active layer. There is a large difference between the carrier concentration in the carrier modulation active layer and the carrier concentration in the first active layer. Since the carrier concentration in the carrier modulation active layer is low, an optical mode produced after stimulated emission of carriers in the carrier modulation active layer is a low-order mode. The first active layer and the carrier modulation active layer are in the same resonant cavity. Therefore, light emitted by carriers in the carrier modulation active layer is fed back to affect the stimulated emission of the first active layer, so that the first active layer also emits light with a gain in the low-order mode, making light emitted by the high-brightness high-power semiconductor light-emitting device in the low-order mode. The presence of the cavity extension layer increases the transmission distance of light, and light in a high-order mode has large divergence. As a result, after the light in the high-order mode is transmitted through the cavity extension layer, the light spot of the high-order mode becomes larger and prone to leakage, making photons concentrated in the low-order mode for gain and amplification. The light in low-order mode has smaller divergence than the light in the high-order mode, thereby reducing the divergence angle and improving the brightness of output light. Second, the structural design is developed from the perspective of distribution characteristics of carriers under current injection, thereby implementing the performance of high brightness and a low divergence angle. Only the epitaxial structure is changed in the structural design. It is not necessary to introduce a new process or structural design in a subsequent manufacturing process, and regulation with an external device is not required, so that the performance of high brightness and a low divergence angle can be actually implemented through one-stop epitaxial growth without a special and complex process, and the manufacturing difficulty and growth and manufacturing costs can be greatly reduced. In general, in the same resonant cavity, the low-order mode is produced in the modulation layer and a feedback is provided to make the whole resonant cavity operate in the low-order mode, thereby improving the brightness and reducing the divergence angle.

BRIEF DESCRIPTION OF THE DRAWINGS

To describe the technical solutions in specific embodiments of the present application or the prior art more clearly, the following briefly introduces the accompanying drawings required for describing the specific embodiments or the prior art. Apparently, the accompanying drawings in the following description show some embodiments of the present application, and a person of ordinary skill in the art may still derive other drawings from these accompanying drawings without creative efforts.

DETAILED DESCRIPTION

The following clearly and completely describes the technical solutions in the present application with reference to the accompanying drawings. Apparently, the described embodiments are some rather than all of the embodiments of the present application. All other embodiments obtained by persons of ordinary skill in the art based on the embodiments of the present application without creative efforts shall fall within the protection scope of the present application.

In the description of the present application, it needs to be understood that orientation or location relationships indicated by terms "center", "up", "down", "left", "right", "vertical", "horizontal", "inside", and "outside" are based on orientation or location relationships shown in the accompanying drawings, and are only used to facilitate description of the present application and simplify description, but are not used to indicate or imply that the apparatuses or elements must have specific orientations or are constructed and operated by using specific orientations, and therefore, cannot be understood as a limit to the present application. In addition, the terms "first", "second", and "third" are used only for description, but are not intended to indicate or imply relative importance.

In addition, the technical features involved in different embodiments of the present application described below can be combined with each other as long as they do not constitute a conflict between them.

Embodiment 1

Figure 1:
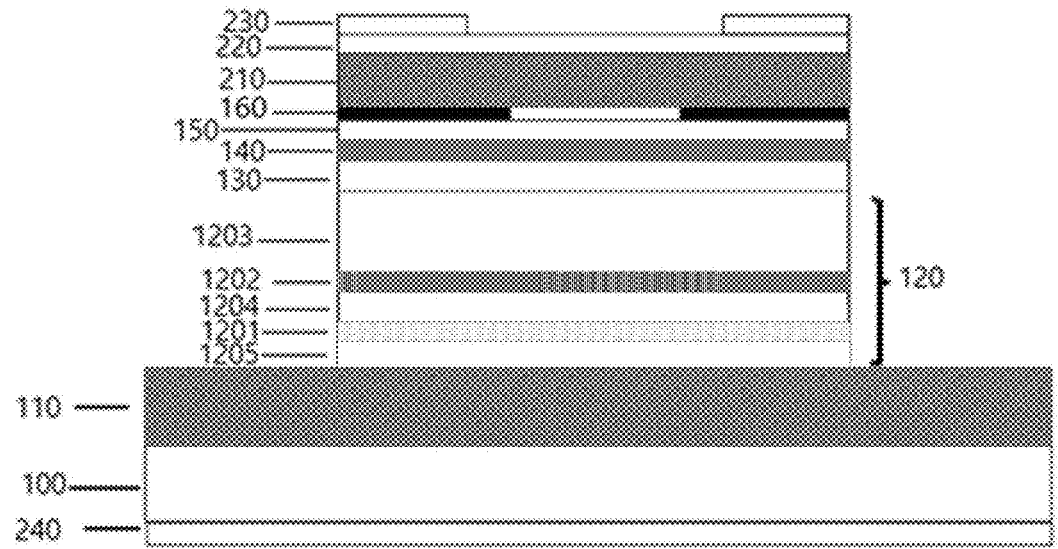
FIG. 1 is a schematic structural diagram of a high-brightness high-power semiconductor light-emitting device according to an embodiment of the present application.

An embodiment of the present application provides a high-brightness high-power semiconductor light-emitting device, referring to FIG. 1, including:

a semiconductor substrate layer 100;

a modulation structure 120 arranged on the semiconductor substrate layer, where the modulation structure 120 includes: a carrier modulation active layer 1201; a modulation tunnel junction 1202 arranged on a side of the carrier modulation active layer 1201 away from the semiconductor substrate layer 100; and a cavity extension layer 1203 arranged on a side of the modulation tunnel junction 1202 away from the carrier modulation active layer 1201;

a first active layer 140 arranged on a side of the modulation structure 120 away from the semiconductor substrate layer 100, where a carrier concentration in the carrier modulation active layer 1201 is less than a carrier concentration in the first active layer 140; and a first current-limiting layer 160 arranged on a side of the first active layer 140 away from the modulation structure 120.

In this embodiment, the high-brightness high-power semiconductor light-emitting device is a vertical-cavity surface-emitting laser.

The material of the semiconductor substrate layer 100 includes silicon, gallium arsenide or aluminum gallium arsenide. In other embodiments, another semiconductor material may be selected as the material of the semiconductor substrate layer 100. This is not limited.

The first current-limiting layer 160 makes carriers pass through a central area of the first active layer 140 instead of an edge area of the first active layer 140. The carriers pass through the cavity extension layer 1203 after passing through the first active layer 140. As the carriers pass through the cavity extension layer 1203, the carriers further diffuse laterally, and as a result the density of the carriers decreases. After the carriers pass through a modulation tunnel junction 1202, electrons and holes are redistributed in an energy band and are then further recombined in the carrier modulation active layer 1201. In this way, under the same current injection, the carrier concentration in the carrier modulation active layer 1201 is lower than the carrier concentration in the first active layer 140. There is a large difference between the carrier concentration in the carrier modulation active layer 1201 and the carrier concentration in the first active layer 140. Since the carrier concentration in the carrier modulation active layer 1201 is low, an optical mode produced after stimulated emission of carriers in the carrier modulation active layer 1201 is a low-order mode. The first active layer 140 and the carrier modulation active layer 1201 are in the same resonant cavity. Therefore, light emitted by carriers in the carrier modulation active layer 1201 is fed back to affect the stimulated emission of the first active layer 140, so that the first active layer 140 also emits light with a gain in the low-order mode, making light emitted by the high-brightness high-power semiconductor light-emitting device in the low-order mode. The presence of the cavity extension layer 1203 increases the transmission distance of light, and light in a high-order mode has large divergence. As a result, after the light in the high-order mode is transmitted through the cavity extension layer 1203, the light spot of the high-order mode becomes larger and prone to leakage, making photons concentrated in the low-order mode for gain and amplification. The light in low-order mode has smaller divergence than the light in the high-order mode, thereby reducing the divergence angle and improving the brightness of output light.

In this embodiment, the structural design is developed from the perspective of distribution characteristics of carriers under current injection, thereby implementing the performance of high brightness and a low divergence angle. Only the epitaxial structure is changed in the structural design. It is not necessary to introduce a new process or structural design in a subsequent manufacturing process, and regulation with an external device is not required, so that the performance of high brightness and a low divergence angle can be actually implemented through one-stop epitaxial growth without a special and complex process, and the manufacturing difficulty and growth and manufacturing costs can be greatly reduced.

In this embodiment, it is not necessary to reduce the exit aperture of the semiconductor light-emitting device to limit a high-order transverse mode, so that the optical power can be high.

In the prior art, the exit aperture of the current-limiting layer needs to be less than 4 micrometers to limit the high-order transverse mode. In the present application, the first current-limiting layer 160 includes a first exit area and a first oxidation area surrounding the first exit area.

The refractive index of the first exit area is greater than the refractive index of the first oxidation area.

In this embodiment, the operating current range of the high-brightness high-power semiconductor light-emitting device is greatly increased.

In an embodiment, the thickness of the cavity extension layer 1203 ranges from 0.5 micrometers to 5 micrometers, and is, for example, 0.5 micrometers, 1 micrometer, 2 micrometers, 3 micrometers, 4 micrometers or 5 micrometers. If the cavity extension layer 1203 is excessively thin, the cavity extension layer 1203 does not significantly increase the transmission distance of light, the degree of the lateral diffusion of carriers is reduced, the leakage of light in the high-order mode is low, and the modulation of the carrier modulation active layer 1201 is weakened. If the cavity extension layer 1203 is excessively thick, the series resistance of the semiconductor light-emitting device, the duration of epitaxial growth, and the absorption loss of carriers are increased.

In an embodiment, the material of the cavity extension layer 1203 includes InGaAlAs, InGaAsP or InGaN.

In an embodiment, the carrier concentration in the carrier modulation active layer 1201 is less than or equal to 30% of the carrier concentration in the first active layer 140. If the carrier concentration in the carrier modulation active layer 1201 is greater than 30% of the carrier concentration in the first active layer 140, the carrier modulation active layer 1201 produces a small amount of light in the low-order mode. In this way, light emitted by the carrier modulation active layer 1201 has low feedback modulation on the first active layer 140.

In a specific embodiment, the carrier concentration in the carrier modulation active layer 1201 is less than or equal to 30% of the carrier concentration in the first active layer 140, and is greater than or equal to 5% of the carrier concentration in the first active layer 140. If the carrier concentration in the carrier modulation active layer 1201 is excessively low, the feedback of the first active layer 1201 is weak.

In an embodiment, a stimulated emission mode field area of the carrier modulation active layer 1201 is less than or equal to 50% of a stimulated emission mode field area of the first active layer 140. If the stimulated emission mode field area of the carrier modulation active layer 1201 is greater than 50% of the stimulated emission mode field area of the first active layer 140, more light in the high-order mode participate in the feedback of the first active layer 140, resulting in weak suppression for the high-order mode.

In a specific embodiment, a stimulated emission mode field area of the carrier modulation active layer 1201 is less than or equal to 50% of a stimulated emission mode field area of the first active layer 140, and is greater than or equal to 10% of the stimulated emission mode field area of the first active layer 140. If the stimulated emission mode field area of the carrier modulation active layer 1201 is excessively small, the feedback of the first active layer 1201 is weak.

The high-brightness high-power semiconductor light-emitting device in this embodiment further includes a first Bragg reflector 110 and a second Bragg reflector 210 that are arranged above the semiconductor substrate layer 100, where the first Bragg reflector 110 is arranged between the modulation structure 120 and the semiconductor substrate layer 100, and the second Bragg reflector 210 is arranged on a side of the first current-limiting layer 160 away from the first active layer 140. The resonant cavity is formed between the first Bragg reflector 110 and the second Bragg reflector 210.

In this embodiment, the modulation structure 120 further includes: a first modulation waveguide layer 1205 arranged between the first active layer 1201 and the first Bragg reflector 110; and a second modulation waveguide layer 1204 arranged between the first active layer 1201 and the modulation tunnel junction 1202. The conductivity type of the first modulation waveguide layer 1205 is an N type, and the conductivity type of the second modulation waveguide layer 1204 is a P type.

The high-brightness high-power semiconductor light-emitting device in this embodiment further includes: a first N-type waveguide layer 130 arranged between the first active layer 140 and the cavity extension layer 1203; and a first P-type waveguide layer 150 arranged between the first active layer 140 and the first current-limiting layer 160.

The high-brightness high-power semiconductor light-emitting device in this embodiment further includes: an ohmic contact layer 220 arranged on a surface of the second Bragg reflector 210 on a side away from the semiconductor substrate layer 100; a first electrode 230 arranged on a surface of the ohmic contact layer 220 on a side away from the second Bragg reflector 210; and a second electrode 240 arranged on a surface of the semiconductor substrate layer on a side away from the first Bragg reflector 110.

Embodiment 2

Figure 2:
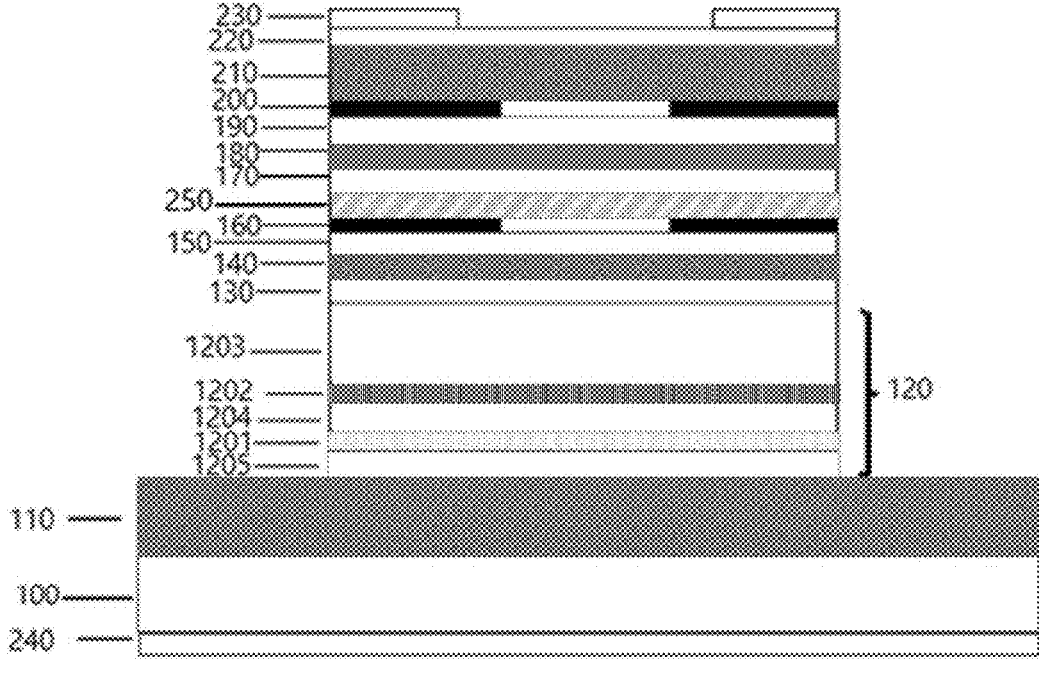
FIG. 2 is a schematic structural diagram of a high-brightness high-power semiconductor light-emitting device according to another embodiment of the present application.

Differences between this embodiment and Embodiment 1 lie in that, referring to FIG. 2, a first active layer 140 to a $Q^{th}$ active layer are disposed between the modulation structure 120 and the second Bragg reflector 210, and Q is an integer greater than or equal to 2; a $(k+1)^{th}$ active layer is arranged on a side of a $k^{th}$ active layer away from the modulation structure 120, and k is an integer greater than or equal to 1 and less than or equal to Q−1: the high-brightness high-power semiconductor light-emitting device further includes: a first tunnel junction 250 to a $(Q-1)^{th}$ tunnel junction, and a $k^{th}$ tunnel junction is arranged between the $(k+1)^{th}$ active layer and the $k^{th}$ active layer; and the first current-limiting layer 160 is arranged between the first tunnel junction 250 and the first active layer 140.

The high-brightness high-power semiconductor light-emitting device in this embodiment further includes: a first Bragg reflector 110 and a second Bragg reflector 210 that are arranged above the semiconductor substrate layer 100, where the first Bragg reflector 110 is arranged between the modulation structure 120 and the semiconductor substrate layer 100, and the second Bragg reflector 210 is arranged on a side of the $Q^{th}$ active layer away from the semiconductor substrate layer 100; an ohmic contact layer 220 arranged on a surface of the second Bragg reflector 210 on a side away from the semiconductor substrate layer 100; a first electrode 230 arranged on a surface of the ohmic contact layer 220 on a side away from the second Bragg reflector 210; and a second electrode 240 arranged on a surface of the semiconductor substrate layer 100 on a side away from the first Bragg reflector 110. The resonant cavity is formed between the first Bragg reflector 110 and the second Bragg reflector 210.

The high-brightness high-power semiconductor light-emitting device in this embodiment further includes: a first N-type waveguide layer 130 to a $Q^{th}$ N-type waveguide layer; and a first P-type waveguide layer 150 to a $Q^{th}$ P-type waveguide layer. It needs to be noted that Q in the present application is only used for describing differentiated naming of objective conception, and the N type and the P type refer to the classification of conductivity types.

The first N-type waveguide layer 130 is arranged between the first active layer 140 and the cavity extension layer 1203; a $(k+1)^{th}$ N-type waveguide layer is arranged between the $(k+1)^{th}$ active layer and the $k^{th}$ tunnel junction; a $k^{th}$ P-type waveguide layer is arranged between the $k^{th}$ active layer and the $k^{th}$ tunnel junction; and the $Q^{th}$ P-type waveguide layer is arranged between the $Q^{th}$ active layer and the second Bragg reflector 210.

In this embodiment, the device further includes: a first current-limiting layer to a $Q^{th}$ current-limiting layer, where the $Q^{th}$ current-limiting layer is arranged between the second Bragg reflector 210 and the $Q^{th}$ active layer, and a $k^{th}$ current-limiting layer is arranged between the $k^{th}$ tunnel junction and the $k^{th}$ active layer, specifically, the $k^{th}$ current-limiting layer is arranged between the $k^{th}$ tunnel junction and the $k^{th}$ P-type waveguide layer.

In this embodiment, an example in which N is equal to 2 is used for description. It needs to be noted that in other embodiments, N may be an integer greater than or equal to 3. This is not limited.

In this embodiment, when N is equal to 2, the device includes: a first N-type waveguide layer 130 arranged between the first active layer 140 and the cavity extension layer 1203; a first P-type waveguide layer 150 arranged between the first active layer 140 and the first tunnel junction 250; a second N-type waveguide layer 170 arranged between the second active layer 180 and the first tunnel junction 250; and a second P-type waveguide layer 190 arranged between the second active layer 180 and the second Bragg reflector 210.

In this embodiment, when N is equal to 2, the device includes: a first current-limiting layer 160 and a second current-limiting layer 200, where the first current-limiting layer 160 is arranged between the first tunnel junction 250 and the first P-type waveguide layer 150, and the second current-limiting layer 200 is arranged between the second P-type waveguide layer 190 and the second Bragg reflector 210.

In this embodiment, the modulation structure 120 further includes: a first modulation waveguide layer 1205 and a second modulation waveguide layer 1204. Details are not described again.

Embodiment 3

This embodiment provides a method for manufacturing a high-brightness high-power semiconductor light-emitting device, referring to FIG. 1, including:

S1: providing a semiconductor substrate layer 100;

S2: forming a modulation structure 120 on the semiconductor substrate layer 100, where the step of forming a modulation structure 120 includes: forming a carrier modulation active layer 1201 on the semiconductor substrate layer 100; forming a modulation tunnel junction 1202 on a side of the carrier modulation active layer 1201 away from the semiconductor substrate layer 100; and forming a cavity extension layer 1203 on a side of the modulation tunnel junction 1202 away from the carrier modulation active layer 1201; and S3: forming a first active layer 140 on a side of the modulation structure 120 away from the semiconductor substrate layer 100, where a carrier concentration in the carrier modulation active layer 1201 is less than a carrier concentration in the first active layer 140, and forming a first current-limiting layer 160 on a side of the first active layer 140 away from the modulation structure 120.

In this embodiment, the method further includes: before the forming a modulation structure 120, forming a first Bragg reflector 110 on the semiconductor substrate layer

100; and forming a second Bragg reflector 210 on a side of the first current-limiting layer 160 away from the first active layer 140.

In an embodiment, the thickness of the cavity extension layer 1203 ranges from 0.5 micrometers to 5 micrometers.

In an embodiment, the material of the cavity extension layer 1203 includes InGaAlAs, InGaAsP or InGaN.

In an embodiment, the carrier concentration in the carrier modulation active layer 1201 is less than or equal to 30% of the carrier concentration in the first active layer 140.

In an embodiment, a stimulated emission mode field area of the carrier modulation active layer 1201 is less than or equal to 50% of a stimulated emission mode field area of the first active layer 140.

In this embodiment, the method further includes: before the forming a carrier modulation active layer 1201, forming a first modulation waveguide layer 1205 on a side of the first Bragg reflector 110 away from the semiconductor substrate layer 100; and before the forming a modulation tunnel junction 1202, forming a second modulation waveguide layer 1204 on a side of the carrier modulation active layer 1201 away from the semiconductor substrate layer 100.

In this embodiment, the method further includes: before the forming a first active layer 140, forming a first N-type waveguide layer 130 on a side of the cavity extension layer 1203 away from the semiconductor substrate layer 100; and before the forming a first current-limiting layer 160, forming a first P-type waveguide layer 150 on a side of the first active layer 140 away from the semiconductor substrate layer 100.

In this embodiment, the method further includes: forming an ohmic contact layer 220 on a surface of the second Bragg reflector 210 on a side away from the semiconductor substrate layer 100; forming a first electrode 230 on a surface of the ohmic contact layer 220 on a side away from the second Bragg reflector 210; and forming a second electrode 240 on a surface of the first Bragg reflector 110 on a side away from the semiconductor substrate layer 100.

Embodiment 4

Differences between this embodiment and Embodiment 3 lie in that: referring to FIG. 2, the method further includes: before the forming a second Bragg reflector, forming a first active layer 140 to a $Q^{th}$ active layer on the side of the modulation structure 120 away from the semiconductor substrate layer 100, where Q is an integer greater than or equal to 2, a $(k+1)^{th}$ active layer is arranged on a side of a $k^{th}$ active layer away from the modulation structure, and k is an integer greater than or equal to 1 and less than or equal to Q–1: and forming a first tunnel junction to a $(Q–1)^{th}$ tunnel junction, where a $k^{th}$ tunnel junction is arranged between the $(k+1)^{th}$ active layer and the $k^{th}$ active layer, where the step of forming a first current-limiting layer is performed before the first tunnel junction is formed.

In this embodiment, the method further includes: before the forming a modulation structure 120, forming a first Bragg reflector 110 on the semiconductor substrate layer 100; and forming a second Bragg reflector 210 on a side of the $Q^{th}$ active layer away from the semiconductor substrate layer 100; forming an ohmic contact layer 220 on a surface of the second Bragg reflector 210 on a side away from the semiconductor substrate layer 100; forming a first electrode 230 on a surface of the ohmic contact layer 220 on a side away from the second Bragg reflector 210; and forming a second electrode 240 on a surface of the semiconductor substrate layer 100 on a side away from the first Bragg reflector 110.

In this embodiment, the method further includes: forming a first N-type waveguide layer 130 to a $Q^{th}$ N-type waveguide layer and a first P-type waveguide layer 150 to a $Q^{th}$ P-type waveguide layer. For the description of the positions of the first N-type waveguide layer 130 to the $Q^{th}$ N-type waveguide layer and the first P-type waveguide layer 150 to the $Q^{th}$ P-type waveguide layer, reference is made to Embodiment 2. Details are not described again.

In this embodiment, the method further includes: Optionally, the method further includes: forming a first current-limiting layer to a $Q^{th}$ current-limiting layer, where a $k^{th}$ current-limiting layer is formed before the $k^{th}$ tunnel junction is formed and after the $k^{th}$ active layer is formed, specifically, the $k^{th}$ current-limiting layer is formed before the $k^{th}$ tunnel junction is formed and after the $k^{th}$ P-type waveguide layer is formed, and the $Q^{th}$ current-limiting layer is arranged between the second Bragg reflector 210 and the $Q^{th}$ active layer.

The $k^{th}$ current-limiting layer includes a $k^{th}$ exit area and a $k^{th}$ oxidation area surrounding the $k^{th}$ exit area. For the aperture of the $k^{th}$ exit area, reference is made to the description of the aperture of the first exit area. The refractive index of the $k^{th}$ exit area is greater than the refractive index of the $k^{th}$ oxidation area. The $Q^{th}$ current-limiting layer includes a $Q^{th}$ exit area and a $Q^{th}$ oxidation area surrounding the $Q^{th}$ exit area. For the aperture of the $Q^{th}$ exit area, reference is made to the description of the aperture of the first exit area. The refractive index of the $Q^{th}$ exit area is greater than the refractive index of the $Q^{th}$ oxidation area. The first exit area to the $Q^{th}$ exit area are aligned in a direction perpendicular to the surface of the semiconductor substrate layer 100.

Embodiment 5

The present application further provides a high-brightness high-power semiconductor light-emitting device, including an active area and a carrier modulation active layer, where a carrier concentration in the carrier modulation active layer is lower than a carrier concentration in the active area, and the carrier modulation active layer is used for generating low-order mode light and adjust, by feedback, the active area to emit low-order mode light.

The active area includes the first active layer in Embodiment 1; or the active area includes the first active layer to the $N^{th}$ active layer in Embodiment 2.

For the carrier modulation active layer in this embodiment, reference is made to the description in embodiment 1 and Embodiment 2.

Obviously, the foregoing embodiments are merely examples for clear description, rather than a limitation to implementations. For a person of ordinary skill in the art, other changes or variations in different forms may also be made based on the foregoing description. All implementations cannot and do not need to be exhaustively listed herein. Obvious changes or variations that are derived there from still fall within the protection scope of present application.

The invention claimed is:

1. A high-brightness high-power semiconductor light-emitting device, comprising:
   a semiconductor substrate layer;
   a modulation structure arranged on the semiconductor substrate layer, wherein the modulation structure comprises: a carrier modulation active layer; a modulation tunnel junction arranged on a side of the carrier modulation active layer away from the semiconductor substrate layer; and a cavity extension layer arranged on a side of the modulation tunnel junction away from the carrier modulation active layer;
   a first active layer arranged on a side of the modulation structure away from the semiconductor substrate layer, wherein a carrier concentration in the carrier modulation active layer is less than a carrier concentration in the first active layer, and the first active layer and the carrier modulation active layer are arranged in the same resonant cavity; and
   a first current-limiting layer arranged on a side of the first active layer away from the modulation structure;
   wherein a stimulated emission mode field area of the carrier modulation active layer is less than or equal to 50% of a stimulated emission mode field area of the first active layer.

2. The high-brightness high-power semiconductor light-emitting device according to claim 1, wherein a thickness of the cavity extension layer ranges from 0.5 micrometers to 5 micrometers.

3. The high-brightness high-power semiconductor light-emitting device according to claim 1, wherein a material of the cavity extension layer comprises InGaAlAs, InGaAsP or InGaN.

4. The high-brightness high-power semiconductor light-emitting device according to claim 1, wherein the carrier concentration in the carrier modulation active layer is less than or equal to 30% of the carrier concentration in the first active layer.

5. The high-brightness high-power semiconductor light-emitting device according to claim 1, further comprising a first Bragg reflector and a second Bragg reflector that are arranged above the semiconductor substrate layer, wherein the first Bragg reflector is arranged between the modulation structure and the semiconductor substrate layer, and the second Bragg reflector is arranged on a side of the first current-limiting layer away from the first active layer.

6. The high-brightness high-power semiconductor light-emitting device according to claim 5, wherein
   the first active layer to a $Q^{th}$ active layer are disposed between the modulation structure and the second Bragg reflector, and Q is an integer greater than or equal to 2; a $(k+1)^{th}$ active layer is arranged on a side of a $k^{th}$ active layer away from the modulation structure, and k is an integer greater than or equal to 1 and less than or equal to Q−1; the high-brightness high-power semiconductor light-emitting device further comprises: a first tunnel junction to a $(Q-1)^{th}$ tunnel junction, and a $k^{th}$ tunnel junction is arranged between the $(k+1)^{th}$ active layer and the $k^{th}$ active layer; and the first current-limiting layer is arranged between the first tunnel junction and the first active layer.

7. The high-brightness high-power semiconductor light-emitting device according to claim 6, further comprising: the first current-limiting layer to a $Q^{th}$ current-limiting layer, wherein a $k^{th}$ current-limiting layer is arranged between the $k^{th}$ tunnel junction and the $k^{th}$ active layer, and the $Q^{th}$ current-limiting layer is arranged between the second Bragg reflector and the $Q^{th}$ active layer.

8. A method for manufacturing a high-brightness high-power semiconductor light-emitting device, comprising:
   providing a semiconductor substrate layer;
   forming a modulation structure on the semiconductor substrate layer, wherein the step of forming a modulation structure comprises: forming a carrier modulation active layer on the semiconductor substrate layer; forming a modulation tunnel junction on a side of the carrier modulation active layer away from the semiconductor substrate layer; and forming a cavity extension layer on a side of the modulation tunnel junction away from the carrier modulation active layer;

forming a first active layer on a side of the modulation structure away from the semiconductor substrate layer, wherein a carrier concentration in the carrier modulation active layer is less than a carrier concentration in the first active layer, and the first active layer and the carrier modulation active layer are arranged in the same resonant cavity; and forming a first current-limiting layer on a side of the first active layer away from the modulation structure;

wherein a stimulated emission mode field area of the carrier modulation active layer is less than or equal to 50% of a stimulated emission mode field area of the first active layer.

9. The method for manufacturing a high-brightness high-power semiconductor light-emitting device according to claim 8, further comprising: before the forming a modulation structure, forming a first Bragg reflector on the semiconductor substrate layer; and forming a second Bragg reflector on a side of the first current-limiting layer away from the first active layer.

10. The method for manufacturing a high-brightness high-power semiconductor light-emitting device according to claim 9, further comprising: before the forming a second Bragg reflector, forming the first active layer to a $Q^{th}$ active layer on the side of the modulation structure away from the semiconductor substrate layer, wherein Q is an integer greater than or equal to 2, a $(k+1)^{th}$ active layer is arranged on a side of a $k^{th}$ active layer away from the modulation structure, and k is an integer greater than or equal to 1 and less than or equal to Q−1; and forming a first tunnel junction to a $(Q-1)^{th}$ tunnel junction, wherein a $k^{th}$ tunnel junction is arranged between the $(k+1)^{th}$ active layer and the $k^{th}$ active layer, wherein the step of forming a first current-limiting layer is performed before the first tunnel junction is formed.

11. The method for manufacturing a high-brightness high-power semiconductor light-emitting device according to claim 10, further comprising: forming the first current-limiting layer to a $Q^{th}$ current-limiting layer, wherein a $k^{th}$ current-limiting layer is formed before the $k^{th}$ tunnel junction is formed and after the $k^{th}$ active layer is formed, and the $Q^{th}$ current-limiting layer is arranged between the second Bragg reflector and the $Q^{th}$ active layer.

12. The method for manufacturing a high-brightness high-power semiconductor light-emitting device according to claim 8, wherein a thickness of the cavity extension layer ranges from 0.5 micrometers to 5 micrometers.

13. The method for manufacturing a high-brightness high-power semiconductor light-emitting device according to claim 8, wherein the carrier concentration in the carrier modulation active layer is less than or equal to 30% of the carrier concentration in the first active layer.

14. A high-brightness high-power semiconductor light-emitting device, comprising an active area and a carrier modulation active layer, wherein a carrier concentration in the carrier modulation active layer is lower than a carrier concentration in the active area, the carrier modulation active layer is used for generating low-order mode light and adjust, by feedback, the active area to emit low-order mode light, the active area comprises a first active layer, and the first active layer and the carrier modulation active layer are arranged in the same resonant cavity, wherein a stimulated emission mode field area of the carrier modulation active layer is less than or equal to 50% of a stimulated emission mode field area of the first active layer.

* * * * *